(12) United States Patent
She et al.

(10) Patent No.: US 11,697,878 B2
(45) Date of Patent: *Jul. 11, 2023

(54) CONTINUOUS MULTIPLE TOW COATING REACTOR

(71) Applicant: RAYTHEON TECHNOLOGIES CORPORATION, Farmington, CT (US)

(72) Inventors: Ying She, East Hartford, CT (US); John E. Holowczak, S. Windsor, CT (US)

(73) Assignee: Raytheon Technologies Corporation, Waltham, MA (US)

( * ) Notice: Subject to any disclaimer, the term of this patent is extended or adjusted under 35 U.S.C. 154(b) by 180 days.

This patent is subject to a terminal disclaimer.

(21) Appl. No.: 17/169,696

(22) Filed: Feb. 8, 2021

(65) Prior Publication Data
US 2021/0164104 A1 Jun. 3, 2021

Related U.S. Application Data

(63) Continuation of application No. 15/713,758, filed on Sep. 25, 2017, now Pat. No. 10,941,491.

(51) Int. Cl.
B65H 57/16 (2006.01)
C23C 16/54 (2006.01)
D02J 1/18 (2006.01)
C04B 35/628 (2006.01)
C23C 16/32 (2006.01)
(Continued)

(52) U.S. Cl.
CPC ........ *C23C 16/54* (2013.01); *C04B 35/62844* (2013.01); *C04B 35/62868* (2013.01); *C04B 35/62878* (2013.01); *C04B 35/62884* (2013.01); *C23C 16/325* (2013.01); *C23C 16/342* (2013.01); *C23C 16/455* (2013.01); *C23C 16/545* (2013.01); *D02J 1/18* (2013.01); *B65H 57/16* (2013.01); *B65H 57/18* (2013.01); *C04B 2235/524* (2013.01); *C04B 2235/5224* (2013.01); *C04B 2235/5228* (2013.01); *C04B 2235/5244* (2013.01); *C04B 2235/5264* (2013.01)

(58) Field of Classification Search
None
See application file for complete search history.

(56) References Cited

U.S. PATENT DOCUMENTS 4,120,079 A * 10/1978 Yamaguchi ............ D01D 11/02
28/282
4,343,836 A 8/1982 Newkirk et al.
(Continued)

FOREIGN PATENT DOCUMENTS

EP 1080846 A1 3/2001

OTHER PUBLICATIONS

European Search Report for European Application No. 18196701.9 dated Feb. 8, 2019.

*Primary Examiner* — Karla A Moore
(74) *Attorney, Agent, or Firm* — Carlson, Gaskey & Olds, P.C.

(57) ABSTRACT

A tow coating reactor system includes a reactor for receiving fiber tow, a wedge situated adjacent the reactor and configured to receive the tow at a tip end, such that as the tow moves across the wedge, the wedge spreads the tow into a plurality of sub-tows.

17 Claims, 3 Drawing Sheets

(51) Int. Cl.
   *C23C 16/34*      (2006.01)
   *C23C 16/455*     (2006.01)
   *B65H 57/18*      (2006.01)

(56) References Cited

U.S. PATENT DOCUMENTS

| | | | |
|---|---|---|---|
| 4,939,002 | A | 7/1990 | Hilakos |
| 5,214,828 | A | 6/1993 | Neuert et al. |
| 5,322,711 | A | 6/1994 | Gabor et al. |
| 5,364,660 | A | 11/1994 | Gabor et al. |
| 5,431,968 | A * | 7/1995 | Miller .................. C23C 16/545 427/577 |
| 5,895,622 | A | 4/1999 | Ramani et al. |
| 6,630,029 | B2 | 10/2003 | Brun |
| 7,381,445 | B2 | 6/2008 | Brun |
| 10,941,491 | B2 | 3/2021 | She et al. |
| 2005/0183669 | A1* | 8/2005 | Parkhe ................ H01L 21/6875 118/724 |
| 2007/0099527 | A1 | 5/2007 | Brun et al. |
| 2009/0035574 | A1 | 2/2009 | Gable et al. |
| 2011/0171399 | A1 | 7/2011 | Brun et al. |
| 2012/0065300 | A1* | 3/2012 | Shah .................... B82Y 40/00 977/742 |
| 2015/0004393 | A1 | 1/2015 | Pegna et al. |
| 2016/0096778 | A1 | 4/2016 | Chamberlain et al. |
| 2016/0122252 | A1 | 5/2016 | Garnier et al. |
| 2019/0039231 | A1 | 2/2019 | Sargsyan |
| 2019/0093231 | A1* | 3/2019 | She ....................... C23C 16/342 |
| 2021/0164104 | A1* | 6/2021 | She ....................... C23C 16/342 |

\* cited by examiner

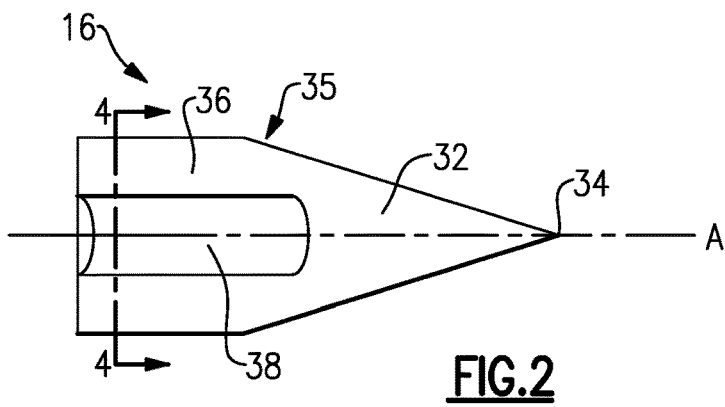
FIG.2
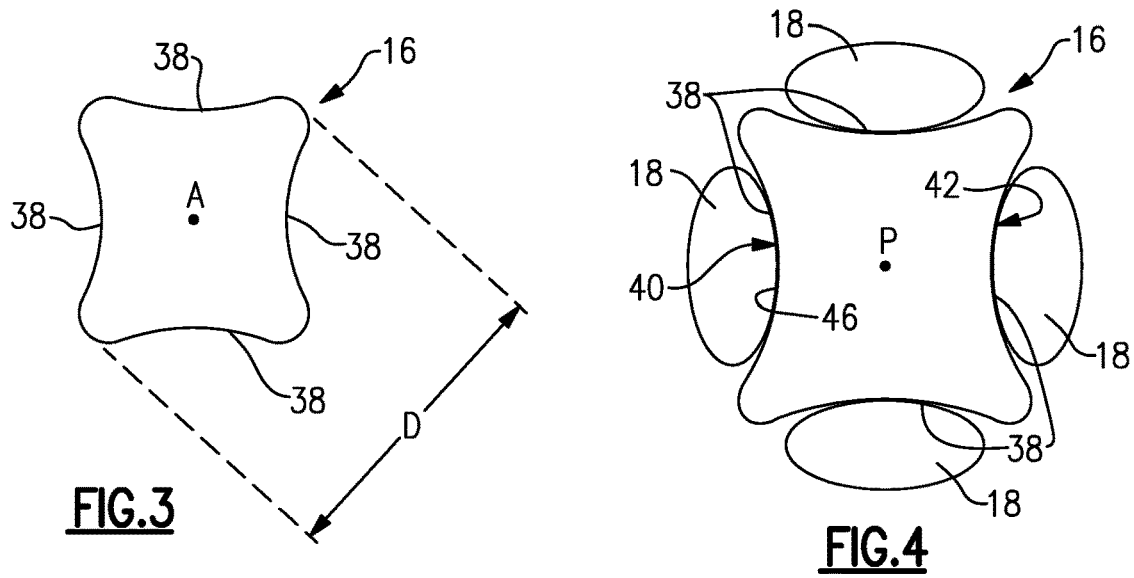
FIG.3
FIG.4
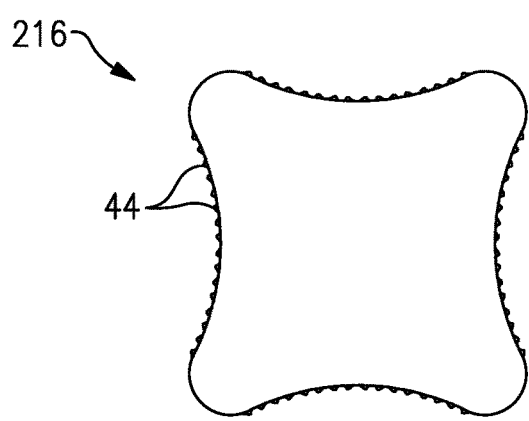
FIG.5

CONTINUOUS MULTIPLE TOW COATING REACTOR

CROSS-REFERENCE TO RELATED APPLICATION

This application is a continuation of U.S. application Ser. No. 15/713,758, which was filed on Sep. 25, 2017.

BACKGROUND

Fiber reinforced ceramic matrix composite (CMC) materials are finding a greater number of applications in high temperature oxidizing environments due to their material properties including, but not limited to, high temperature and oxidation resistance, high strength and creep resistance, high thermal conductivity and low weight.

An advantage of CMC materials compared to their corresponding monolithic materials is that such materials are significantly tough even though their constituents may be intrinsically brittle. This feature is achieved by utilizing an appropriate fiber/matrix interface coating(s) that arrest and deflect cracks formed under load in the brittle matrix and prevent early failure. Furthermore, the interface coatings protect the fibers from detrimental interactions with each other, with the matrix, and with the environment in the CMC component application(s). Therefore, interface coatings play an important role in the performance and lifetime of CMC materials during their applications.

The disclosure relates to a method and reactor system for applying a coating to a fiber, such as by chemical vapor deposition (CVD).

SUMMARY

A method for a tow coating reactor system according to an example of the present disclosure includes a reactor for receiving fiber tow and a wedge situated adjacent the reactor and configured to receive the tow at a tip end, such that as the tow moves across the wedge, the wedge spreads the tow into a plurality of sub-tows.

In a further embodiment according to any of the foregoing embodiments, the wedge includes a tapered portion including a tip in line with the fiber tow.

In a further embodiment according to any of the foregoing embodiments, the wedge includes an untapered portion downstream of the tapered portion.

In a further embodiment according to any of the foregoing embodiments, the wedge has a coating.

In a further embodiment according to any of the foregoing embodiments, the coating is a diamond-like carbon coating.

In a further embodiment according to any of the foregoing embodiments, the wedge includes a plurality of longitudinal grooves, and each of the plurality of longitudinal grooves configured to receive one of the plurality of sub-tows.

In a further embodiment according to any of the foregoing embodiments, the continuous line of fiber tow has a tow center axis, the wedge has a wedge center axis, and the tow center axis and the wedge center axis are aligned.

In a further embodiment according to any of the foregoing embodiments, the wedge includes a first half surface and a second half surface opposite the first half surface, and the wedge is positioned such that one of the plurality of sub-tows runs across the first half surface, and a second of the plurality of sub-tows runs across the second half surface.

In a further embodiment according to any of the foregoing embodiments, the wedge includes a plurality of longitudinal grooves, and each of the plurality of longitudinal grooves configured to receive one of the plurality of sub-tows.

In a further embodiment according to any of the foregoing embodiments, a second wedge is opposite of the reactor from the first wedge.

In a further embodiment according to any of the foregoing embodiments, the second wedge is configured to consolidate the plurality of sub-tows into a single tow.

In a further embodiment according to any of the foregoing embodiments, the wedge is configured to untwist the fiber tow, and the second wedge is configured to twist the plurality of sub-tows.

In a further embodiment according to any of the foregoing embodiments, the wedge includes a plurality of fins.

A method for coating a fiber tow according to an example of the present disclosure includes moving a fiber tow across a wedge to separate the fiber tow into a plurality of tub-tows and coating the plurality of sub-tows.

In a further embodiment according to any of the foregoing embodiments, the plurality of sub-tows is consolidated into a single tow.

In a further embodiment according to any of the foregoing embodiments, the wedge includes a tapered portion including a tip in line with the fiber tow.

In a further embodiment according to any of the foregoing embodiments, the tow is untwisted before the coating and the tow is twisted after coating.

A wedge configured to split a tow into a plurality of sub-tows according to an example of the present disclosure includes a tapered portion, an untapered portion adjacent to the tapered portion, a plurality of grooves provided by at least one of the tapered portion and the untapered portion, and each of the plurality of grooves is configured to receive one of the plurality of sub-tows

BRIEF DESCRIPTION OF THE DRAWINGS

FIG. 2 illustrates a side view of an example wedge.

FIG. 3 illustrates a cross sectional view of the example wedge.

FIG. 4 illustrates a cross sectional view of the example wedge receiving sub-tows.

FIG. 5 illustrates a cross sectional view of another example wedge.

DETAILED DESCRIPTION

Figure 1:
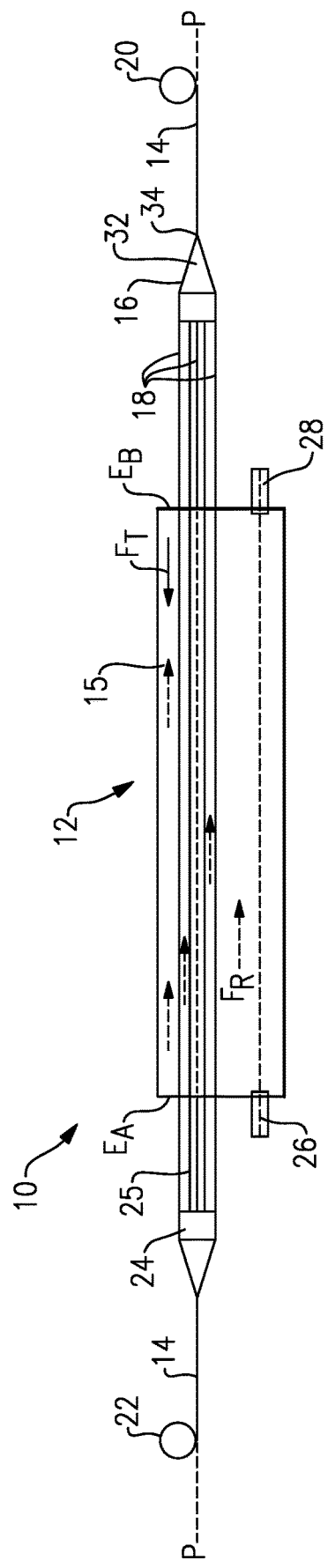
FIG. 1 schematically illustrates an example tow-coating reactor system.

FIG. 1 schematically illustrates a system 10 for continuously coating tow fibers. The system 10 includes a reactor 12 positioned to receive a continuous line of fiber tow 14. It was difficult previously to apply a uniform coating to a fiber tow. As will be described, the system 10 can uniformly coat the tow 14, effectively splitting the tow into sub-tows and applying a uniform coating to each sub-tow.

The reactor 12 is configured to coat the fiber tow 14. The fiber tow 14 is passed through a chamber 15 of the reactor 12, and a reactant gas is injected into the chamber 15. One example coating material is boron nitride, but one of ordinary skill having the benefit of this disclosure would realize that other coating materials, including but not limited to silicon nitride, silicon carbide, and boron carbide can be utilized. One example reactor 12 is a chemical vapor deposition (CVD) reactor, but one of ordinary skill having the benefit of this disclosure would realize that other reactors may be utilized. The reactant(s) used in the reactor 12 is/are determined by the desired coating. Some coatings may be produced by decomposition of a single reactant gas. For example, deposition of carbon may be accomplished by decomposition of a hydrocarbon, such as methane. A two-gas reaction may be used for other coatings. For example, a boron trichloride and ammonia reaction may be used to form boron nitride. A three gas reaction such as boron trichloride, ammonia and a silicon precursor may be used to form a desired coating. Silicon precursors include dichlorosilane, trichlorosilane, silicon tetrachloride, and silane. Hydrogen or nitrogen may be used to dilute precursor gases to control reaction speed and temperature.

The tow fibers 14 to be coated may be fibers made from one of SiC, carbon, alumina, aluminum silicate, mullite, and silicon nitride, as well as from other materials. The tow fibers 14 can have a diameter of from 4 to 25 microns. The tow fibers 14 may contain from 2 to 12000 fibers, depending on fiber type, size and intended use.

A tow-splitting wedge 16 is situated adjacent the reactor 12 to split the fiber tow 14 into a plurality of sub-tows 18 before the plurality of sub-tows 18 enter the chemical vapor disposition reactor 12. The sub-tows 18 are spaced from one another while passing through the chamber 15 and receiving coating. Each sub-tow 18 may include a plurality of individual filaments that make up the fiber tow 14. Alternatively, each sub-tow 18 may have one filament. The wedge 16 may include a tip 34 and is configured to receive the tow 14 at the tip 34, such that as the tow 14 moves across the wedge 16, the wedge 16 spreads the tow into a plurality of sub-tows 18.

The tow-coating reactor system 10 is a continuous system, such that the fiber tow 14 runs from a take-off spool 20, across the wedge 16, through the chemical vapor deposition reactor 12, and to a take-up spool 22. The system 10 may further include a consolidator 24 between the reactor 12 and the take-up spool 22 for consolidating the coated sub-tows 18 back into a single tow 14 after the coated sub-tows 18 exit the reactor 12. In one example, the consolidator 24 is substantially the same as the wedge 16 but oriented in the opposite direction. In another example, the consolidator 24 is a ring, such that the sub-tows 18 run through the inner diameter of the ring to be consolidated into a single tow 14. In other examples, a consolidator 24 is not utilized.

The wedge 16 and consolidator 24 may be connected by a support 25. In one example, the support 25 is a rotatable axle, such that the wedge 16 may be rotated as the tow travels across to untwist the tow 14 to form the sub-tows 18. The consolidator 24 is rotated at the same speed in the same rotational direction to that of the wedge 16 to twist the sub-tows 18 back into an individual tow 14. Alternatively, the support 25 may be fixed against rotation, such that only the geometry of the wedge 16 and the consolidator 24 function to split and combine the tow 14. The sub-tows 18 may be substantially parallel to one another when in the reactor 12.

The reactor 12 may include a reactant inlet 26 for injecting the coating reactant into the chamber 15 and a reactant outlet 28 for the reactant exhaust to exit the chamber 15. The reactant inlet 26 and the reactant outlet 28 may be parallel to the fiber tow center axis P. In the example, the reactant inlet 26 is located at the longitudinal end $E_A$ of the chamber 15 and the reactant outlet 28 is located at the longitudinal end $E_B$ of the chamber opposite the longitudinal end $E_A$, such that the reactant flows within the chamber 15 in the direction $F_R$ from end $E_A$ toward end $E_B$. The sub-tows 18 enter the chamber from end $E_B$ and exit through end $E_A$ such that the sub-tows 18 travel in the direction $F_T$ from $E_B$ to $E_A$—opposite the reactant flow direction. Alternatively, the directions $F_R$ and $F_T$ may be the same.

FIG. 2 illustrates one example wedge 16 including a tapered portion 32 that converges to a tip 34. In one example, the tip 34 is axially aligned with the fiber tow center axis P, with reference to FIG. 1, in line with the fiber tow 14. The tapered portion 32 serves to gradually split the tow 14 radially outward into separate sub-tows 18 that are radially spaced from one another with respect to the tow center axis P, as the tow 14 travels from the point 34 to the wide end 35 of the tapered section 32. The tow 14 is received at the tip 34, such that as the tow moves across the wedge, the wedge spreads the tow 14 into the sub-tows 18.

The wedge 16 may include a substantially untapered portion 36 downstream of the tapered portion 32. The substantially untapered portion 36 has a substantially constant diameter as it extends axially. The substantially untampered portion 36 defined the maximum tow spread width for the sub-tows 18. The wedge 16 may include one or more longitudinal grooves 38 each configured to receive a sub-tow 18. The one or more longitudinal grooves 38 may extend axially from the substantially untapered portion 36 into the tapered portion 32 or, alternatively, be only within the substantially untapered portion 36.

FIG. 3 shows a cross-sectional view of an example wedge 16. The example wedge 16 includes four grooves 38, such that the wedge 16 is configured to split a tow 14 into four sub-tows 18. More or fewer grooves 38 for more or fewer sub-tows 18 may alternatively be used. In some examples, a range of two to eight grooves 38 may be used for a range of two to eight sub-tows 18 in the system 10.

The wedge 16 may include a maximum diameter D. In some examples, the maximum diameter D is less than or equal to 0.5 inches. In some examples, the maximum diameter D is between 0.25 and 0.5 inches.

FIG. 4, with continued reference to FIGS. 1-3, illustrates a cross sectional view of the wedge 16 splitting the fiber tow 14 into a plurality of sub-tows 18. Each of the plurality of grooves 38 receives one or more sub-tows 18. The sub-tows 18 are radially split such that each sub-tow 18 is spaced an increased distance from the tow center axis P relative to its distance from the center axis of the tow before contacting the wedge 16. In the example, the tow 14 has a center axis P, the wedge 16 has a center axis A, and the center axis P and the center axis A are aligned, but other configurations are contemplated.

The wedge 16 radially splits the tow 14 into sub-tows 18. The wedge 16 may include one half surface 40 and a second half surface 42 opposite the half surface 40. The wedge 16 may be positioned such that one sub-tow 18 runs along the half surface 40 and at least one other sub-tow 18 runs along the half surface 42. In the four grooved example, each half surface 40, 42 includes two grooves 38.

In some examples, the wedge 16 may have a diamond-like carbon coating to create a smooth low-friction surface. A smooth surface facilitates reducing risk that the wedge 16 abrades or wears the individual filaments of each sub-tow 18. The wedge 16 may include a core material of silicon nitride, silicon carbide, aluminum oxide, aluminum nitride, boron nitride, boron carbide, or other abrasion-resistant materials. A person of ordinary skill in the art having the benefit of this disclosure would recognize that other core materials could be used.

FIG. 5 illustrates a cross sectional view of an example wedge 216 for use in a system that twists and untwists a tow 14. The wedge 216 includes a plurality of fins 44 that serve to increase friction between the wedge 216 and the sub-tows 18. The friction facilitates maintaining the sub-tows 18 on the wedge 216, evenly distributing the sub-tows 18 about the wedge 216 during twisting. The consolidator 24 may also include a plurality of fins 44.

Figure 6:
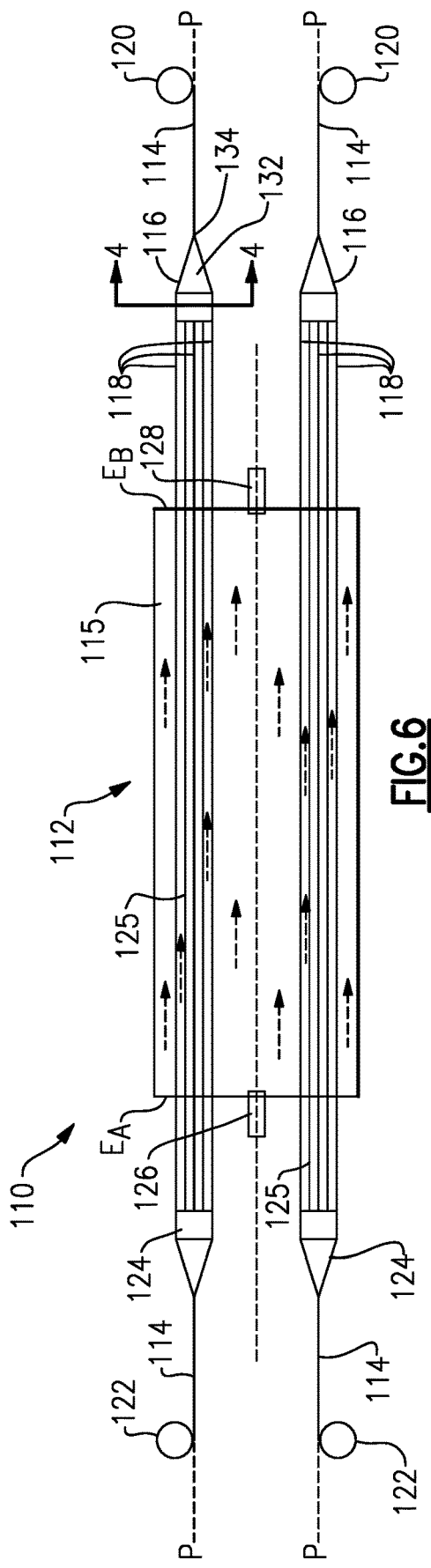
FIG. 6 schematically illustrates another example tow-coating reactor system.

FIG. 6 schematically illustrates a second example tow-coating reactor system 110 including a reactor 112 positioned to receive multiple continuous lines of fiber tow 114. In the example, there are two continuous lines of fiber tow 114. The reactor 112 is configured to provide coatings to the fiber tows 114. The fiber tows 114 are passed through a chamber 115 of the reactor 112, and a reactant gas is injected into the chamber 115.

Tow-splitter wedges 116 are positioned to split each fiber tow 114 into a plurality of sub-tows 118 before the plurality of sub-tows 118 enter the chemical vapor disposition reactor 112. The tow-coating reactor system 110 is a continuous system, such that the fiber tows 114 runs from take-off spools 120, across the wedges 116, through the chemical vapor deposition reactor 112, and to take-up spools 122. The system may further include consolidators 124 between the reactor 112 and the take-up spools 122 for combining the sub-tows 118 back into single tows 114 after the sub-tows 118 exit the reactor 112.

The wedge 116 and consolidator 124 may be connected by a support 125. In one example, the support 125 is a rotatable axle, such that the wedge 116 may be rotated as the tow travels across to untwist the tow 114 to form the sub-tows 118. The consolidator 124 is rotated at the same speed in the same rotational direction to that of the wedge 116 to twist the sub-tows 118 back into an individual tow 114. Alternatively, the support 125 may be fixed against rotation, such that only the geometry of the wedge 116 and the consolidator 124 function to split and combine the tow 114. The sub-tows 118 may be substantially parallel to one another when in the reactor 112.

The reactor 112 may include a reactant inlet 126 for injecting the coating reactant into the chamber 115 and a reactant outlet 128 for the reactant exhaust to exit the chamber 115. In the example, the reactant inlet 126 is located at the longitudinal end $E_A$ of the chamber 115 and the reactant outlet 128 is located at the longitudinal end $E_B$ of the chamber opposite the longitudinal end $E_A$, such that the reactant flows within the chamber 115 in the direction $F_R$ from end $E_A$ toward end $E_B$. The sub-tows 118 enter the chamber from end $E_B$ and exit through end $E_A$ such that the sub-tows 118 travel in the direction $F_T$ from $E_B$ to $E_A$—opposite the reactant flow direction. Alternatively, the directions $F_R$ and $F_T$ may be the same.

Figure 7:
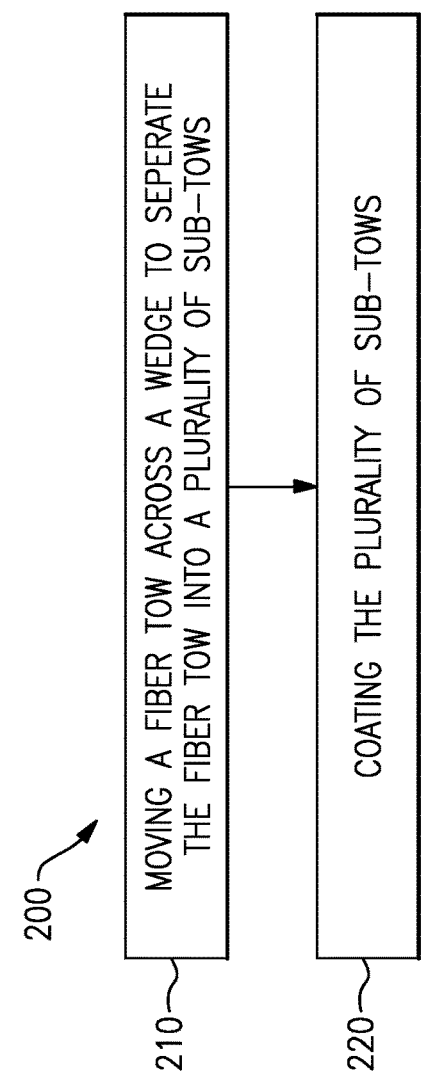
FIG. 7 is a flow chart of an example method for coating a fiber tow.

FIG. 7 illustrates a flow chart of a method 200 for coating a fiber tow, which, in some examples, may be used with any of the systems or components in this disclosure. At 210, the method includes moving a fiber tow across a wedge to separate the fiber tow into a plurality of sub-tows. At 220, the method includes coating the plurality of sub-tows.

The method 200 may further include consolidating the plurality of sub-tows into a single tow.

The method 200 may further include untwisting the tow before entry into the chemical vapor deposition reactor. The method may further include twisting the tow after exit from the chemical vapor deposition reactor.

The systems and methods in this disclosure allow for a fiber tow to be split into radially separated sub-tows. By radially separating the sub-tows, a more uniform interphase coating of the fiber tow may be achieved. Reactants diffuse inside the sub-tows more easily as a result of the radial separation because the inner filaments of the tow are more accessible to the reactants. This results in improved performance and lifetime of the CMC materials having these fibers because the interface coatings are more uniform. In addition, a better precursor utilization will be achieved.

As can be seen from the above description, a continuous CVD interface coating system and method for the fabrication of CMC composite parts has been presented. The system and method described herein can improve the performance and lifetime of CMC materials during their applications due to the manner in which the interface coatings are formed more uniformly on the tow fibers. The system and process described herein can allow improvements in the thickness distribution of interface coatings.

Although example geometries for tow-splitting wedges are disclosed, one of ordinary skill in the art having the benefit of this disclosure would recognize that other components could be used to radially split a tow 14 into a plurality of sub-tows 18.

Although the systems and methods disclosed involve closed chemical vapor deposition processes, one of ordinary skill in the art having the benefit of this disclosure would recognize that the components disclosed, including but not limited to the wedge 16, could also be used with open chemical vapor deposition processes.

Although the different examples have the specific components shown in the illustrations, embodiments of this disclosure are not limited to those particular combinations. It is possible to use some of the components or features from one of the examples in combination with features or components from another one of the examples.

One of ordinary skill in this art would understand that the above-described embodiments are exemplary and non-limiting. That is, modifications of this disclosure would come within the scope of the claims. Accordingly, the following claims should be studied to determine their true scope and content.

What is claimed is:

1. A tow coating reactor system comprising:
a reactor for receiving fiber tow; and
a wedge situated adjacent the reactor and configured to receive the tow at a tip end, such that as the tow moves across the wedge, the wedge spreads the tow into a plurality of sub-tows, wherein the wedge includes a plurality of longitudinal grooves, each of the plurality of longitudinal grooves configured to receive one of the plurality of sub-tows, and the wedge includes a plurality of fins within each of the plurality of longitudinal grooves.

2. The tow-coating reactor system as recited in claim 1, wherein the wedge includes a tapered portion including a tip in line with the fiber tow.

3. The tow-coating reactor system as recited in claim 2, wherein the wedge includes an untapered portion downstream of the tapered portion.

4. The tow-coating reactor system as recited in claim 1, wherein the wedge has a coating.

5. The tow-coating reactor system as recited in claim 4, wherein the coating is a diamond-like carbon coating.

6. The tow-coating reactor system as recited in claim 1, wherein the fiber tow has a tow center axis, the wedge having a wedge center axis, and the tow center axis and the wedge center axis are aligned.

7. The tow-coating reactor system as recited in claim 1, wherein the wedge includes a first half surface and a second half surface opposite the first half surface, and the wedge is positioned such that one of the plurality of sub-tows runs across the first half surface, and a second of the plurality of sub-tows runs across the second half surface.

8. The tow-coating reactor system as recited in claim 1, comprising a second wedge opposite the reactor from the wedge.

9. The tow-coating reactor system as recited in claim 8, wherein the second wedge is configured to consolidate the plurality of sub-tows into a single tow.

10. The tow-coating reactor system as recited in claim 9, wherein the wedge is configured to untwist the fiber tow, and the second wedge is configured to twist the plurality of sub-tows.

11. The tow-coating reactor as recited in claim 10, the second wedge is substantially the same as the wedge but oriented in an opposite direction.

12. The tow-coating reactor system as recited in claim 11, wherein the second wedge includes a second plurality of fins within each of a second plurality of longitudinal grooves.

13. The tow-coating reactor system as recited in claim 10, wherein the wedge includes a tapered portion including a tip in line with the fiber tow.

14. The tow-coating reactor system as recited in claim 13, wherein the wedge includes an untapered portion downstream of the tapered portion.

15. The tow-coating reactor system as recited in claim 14, wherein the second wedge includes a second plurality of fins within each of a second plurality of longitudinal grooves.

16. The tow-coating reactor system as recited in claim 8, the second wedge is substantially the same as the wedge but oriented in an opposite direction.

17. The tow-coating reactor system as recited in claim 8, wherein the second wedge includes a second plurality of fins within each of a second plurality of longitudinal grooves.

\* \* \* \* \*